(12) United States Patent
Oyelayo et al.

(10) Patent No.: US 6,432,480 B1
(45) Date of Patent: Aug. 13, 2002

(54) MODIFIED BORON CONTAINING COATING FOR IMPROVED WEAR AND PITTING RESISTANCE

(75) Inventors: Ajayi O. Oyelayo, Peoria; Michael H. Haselkorn, Dunlap, both of IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 09/405,770

(22) Filed: Sep. 27, 1999

(51) Int. Cl.[7] .................. C23C 16/00; C23C 16/22; C23C 16/32; C23C 16/34

(52) U.S. Cl. ............... 427/255.7; 427/249.5; 427/255.394

(58) Field of Search .............. 427/248.1, 249.1, 427/249.5, 249.14, 255.7, 299, 314, 318, 327, 402, 419.1, 419.2, 419.3, 419.7, 457, 569, 577; 428/216; 252/12, 25

(56) References Cited

U.S. PATENT DOCUMENTS

| | | | |
|---|---|---|---|
| 4,166,148 A | * 8/1979 | Sakurai | 428/332 |
| 4,364,995 A | * 12/1982 | Crawford et al. | 428/336 |
| 5,282,985 A | * 2/1994 | Zabinski et al. | 252/12 |
| 5,549,764 A | 8/1996 | Biltgen et al. | 148/222 |

OTHER PUBLICATIONS

Erdemir et al., Appl. Phys. Lett. (1996), 68(12), pp. 1637–1639.*

Belitskii et al., Porosh. Met. (1969), 9(3), pp. 45–49.*

* cited by examiner

Primary Examiner—Timothy Meeks
Assistant Examiner—William Phillip Fletcher, III
(74) Attorney, Agent, or Firm—Kathleen R. Carey; Robert J. Hampsch

(57) ABSTRACT

The invention consists of a coated metallic component which exhibits improved wear and pitting resistance, and a method for making the invention. A metallic component is coated with a functionally gradient material utilizing both a non-oxide containing coating and boron oxide coating. This invention is useful for rolling and sliding contacts.

6 Claims, 2 Drawing Sheets

MODIFIED BORON CONTAINING COATING FOR IMPROVED WEAR AND PITTING RESISTANCE

TECHNICAL FIELD

This invention relates generally to a method of making a metallic article being coated to have enhanced wear resistance and an increased pitting resistance.

BACKGROUND OF THE INVENTION

It is well known that lubricated concentrated rolling contacts can fail from surface or subsurface initiated pitting. Sliding contacts can fail from excessive wear, scuffing or seizure. These failure mechanisms are controlled globally by oil film thickness, hertzian contact stresses, and lubrication at asperity contacts. These factors, in conjunction with other factors, determine the distribution of contact stresses near asperities, friction coefficient, and contact flash temperature. All of these factors will influence pitting and wear failures.

Meshing of teeth contact surfaces in gears usually operate in the region of mixed-film lubrication where the film thickness to roughness ratio, lambda, is less than three. This results in the load being shared between the fluid and the asperity contact. The lubrication behavior in this region is influenced by the overall distributions of lubricant film thickness, pressure, shear stress and flash temperatures within the hertzian contact and the local variation of these quantities around the asperity contacts.

The combination of rolling and sliding can initiate fatigue cracks at the surface that will result in pit formation. A high percentage of carbides or nitrides produced at the surface of a component result in greater high temperature strength, resistance to wear, and increased pitting life. Currently, non-oxide boron containing coatings, e.g. boron carbide and boron nitrides, are being used to enhance wear resistance in rolling, sliding, and mixed mode contact surfaces as set forth in U.S. Pat. No. 5,549,764 "Wear Resistant Coated Steel Article" which issued Aug. 27, 1996 to Gary L. Biltgen and is assigned to Caterpillar Inc.

However, in actual practice it has become apparent that additional frictional reduction and wear resistance is desirable.

The present invention is directed to overcoming one or more of the problems as set forth above.

DISCLOSURE OF THE INVENTION

The invention may be characterized as a modified boron coated metallic component having improved enhanced wear resistance and increased pitting resistance.

The component comprises a metallic substrate, a first coating (e.g. boron carbide), a second coating (e.g. an mixture of boron carbide and boron oxide) and a third coating(e.g. boron oxide) deposited on the substrate. The first coating has a thickness generally no greater than about 3.0 microns. The second coating has a thickness no greater than 1 micron. The third coating has a thickness generally no greater than about 0.5 microns.

In one aspect of the invention, a coated wear resistant metallic article and method of making the article of this invention comprises a basic article, a first coating material, a second coating, and a third coating. The basic article is a metallic material, preferably steel. The first coating material is a non-oxide boron containing coating, preferably boron carbide. The second coating is a mixture of the non-oxide boron containing coating and boron oxide. The third coating material is boron oxide.

A further aspect of the invention is that the disclosed coatings of the metallic component operate to augment the wear resistance and pitting resistance of the component. This can significantly reduce the possibility of failures of the metallic component.

BEST MODE FOR CARRYING OUT THE INVENTION

The following description is the best mode presently contemplated for carrying out the invention. This description is not to be taken in a limiting sense, but is made merely for the purpose of describing the general principals of the invention. The scope and breadth of the invention should be determined with reference to the claims.

Figure 1:
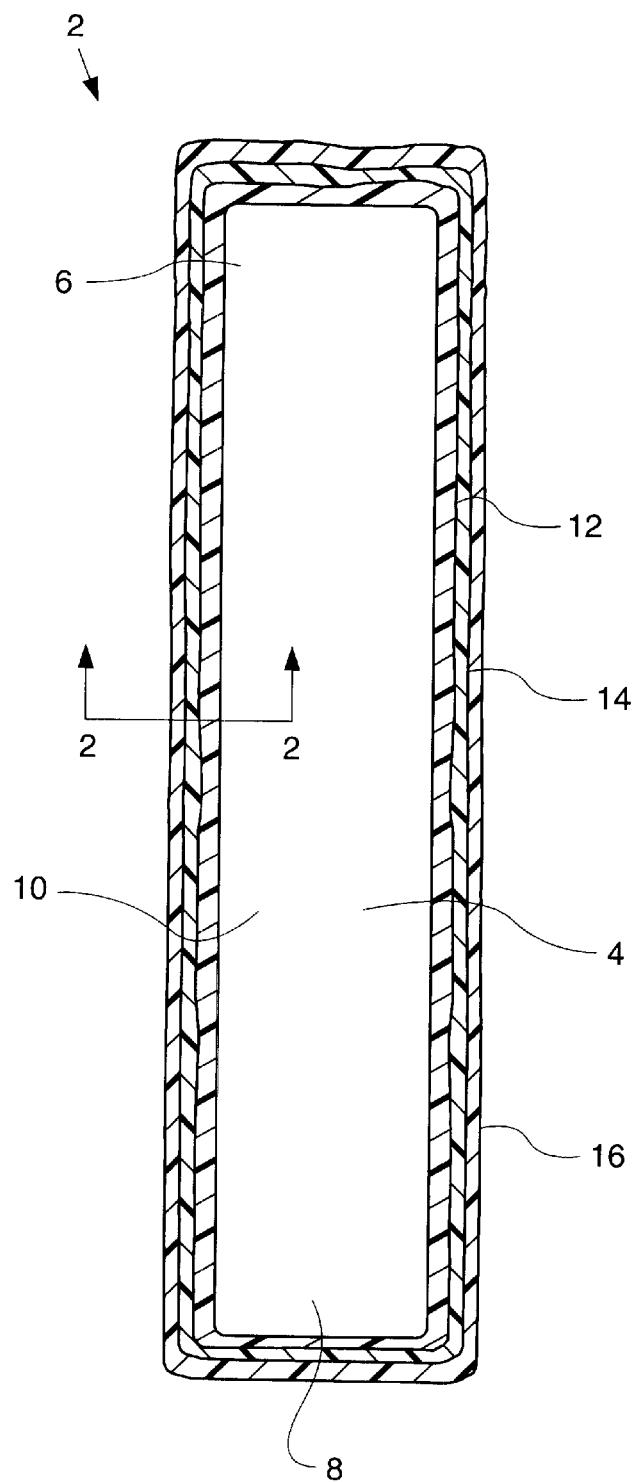
FIG. 1 is a side view of a coated metallic article.

Turning to FIG. 1, there is shown a side view of a coated metallic piece in accordance with the present invention. As seen in FIG. 1, the illustrated metallic piece 2 includes a main body section 4, a first end section 6, and a second end section 8. The various sections are formed or machined from a metallic substrate, 10, preferably steel. In this application, the metallic piece is used for a wear component, such as a gear.

Composition of the first coating 12 is preferably selected from the group consisting of non-oxide boron containing coatings, and in particular, boron carbide or boron nitride. The first coating thickness should be fairly uniform as measured by the Ball Crater Test at a plurality of locations on the component. Alternatively, one can demonstrate uniform coating thickness through scanning electron microscopy measurements on a sample of selected cross sections of the coated component, or with X-ray fluorescence.

Figure 2:
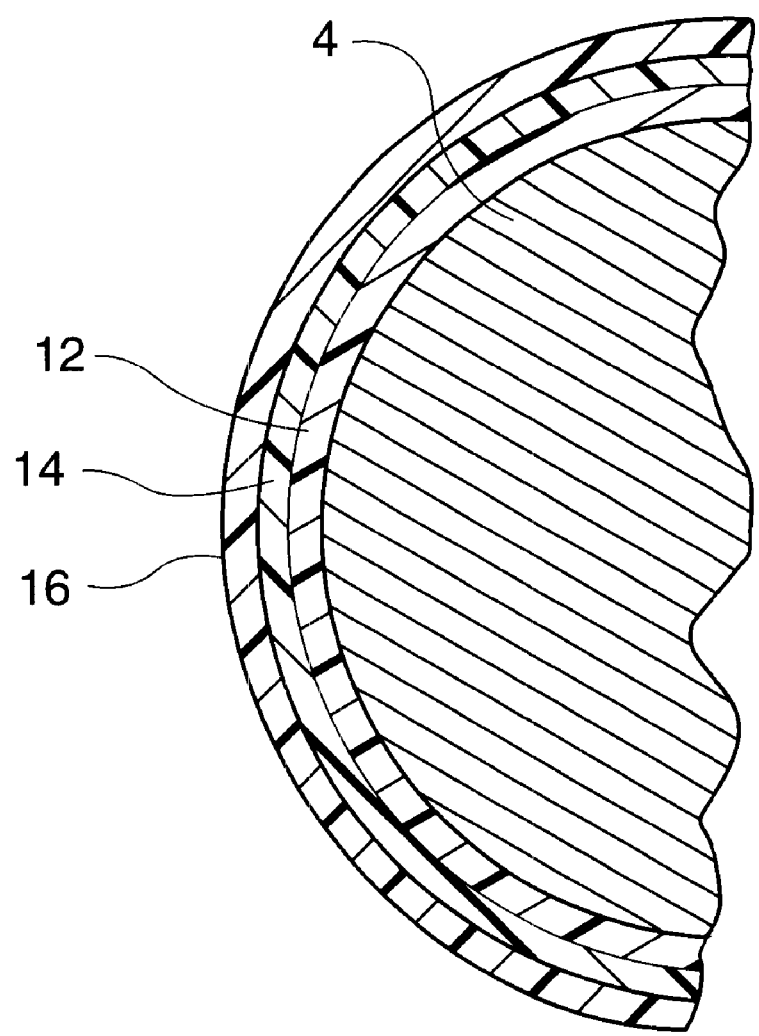
FIG. 2 is a cross-sectional view of a coated metallic article in accordance with the present invention.

In the preferred embodiment, as best shown in FIG. 2, the first coating 12 has a thickness desirably no greater than about 3.0 microns and preferably has a thickness of between about 1.0 microns and about 3.0 microns. A first coating thickness greater than about 3.0 microns is undesirable because the first coating may disbond from the surface.

Composition of a second coating 14 consists of a mixture of boron carbide and boron oxide. The composition of this mixture will gradually change from 100% boron carbide to 100% boron oxide. The coating thickness of the second coating 14 should be no greater than 1.0 microns, and preferably has a thickness between about 0.5 to 1.0 microns.

Composition of the third coating 16 consists of boron oxide. The coating thickness of the third coating 16 should be no greater than 0.5 microns, and preferably has a thickness between about 0.2–0.5 microns.

The third coating 16 thickness should be fairly uniform as by the Ball Crater Test at a plurality of locations. Alternatively, one can demonstrate uniform third coating thickness through scanning electron microscopy measurements on a sample of selected cross sections of the fuel injector plungers, or through the use of X-ray fluorescence.

Although not shown, it is readily understood by those skilled in the art that in addition to coating a metallic piece, it would be equally advantageous to provide a coating to such components as gears, bushings, pins, and bearing races.

Any one of the vapor deposition techniques, such as physical vapor deposition (e.g. sputtering) or chemical vapor deposition can be employed to deposit the first, second, and third coatings on the metallic substrate. In the preferred embodiment, the first non-oxide boron containing coating is deposited by physical vapor deposition (PVD) process. In the preferred embodiment, the second and third boron oxide coatings are created by increasing the oxygen partial pressure at the conclusion of the physical vapor deposition (PVD) process.

The first non-oxide boron containing coating is formed on the surface of the metallic substrate by transferring either boron carbide or boron from a target.

If the first non-oxide boron containing coating is transferred from a target, argon is added to the atmosphere to form a non-reactive atmosphere to prevent the reduction of the boron carbide and to insure the proper composition is deposited on the metallic substrate.

If boron is transferred from a target, methane or propane is added to the atmosphere to react with the boron and form boron carbide on the surface of the metallic substrate.

Then, near the end of the reaction, oxygen is gradually added to the argon to form the second layer that consists of a mixture of boron carbide and boron oxide. The composition of the second layer will gradually be changed from non-oxide boron containing coating to boron oxide until the third layer, which is formed on top of the second layer, will be 100% boron oxide.

In another aspect of the invention, the first, second, and third coatings may be applied by the chemical vapor deposition (CVD) process. In the chemical vapor deposition process, a boron containing gas with methane on the surface of the substrate reacts to form the non-oxide boron containing first coating layer. Like the physical vapor deposition process, near the end of the reaction, oxygen is added, replacing the methane, to first form a mixture of the non-oxide boron containing coating and oxide.

In yet another embodiment of the invention, the third boron oxide coating 16 may be formed by heating the first non-oxide boron containing coating 12 to above 500 degrees C for about 1 hour in an oxidizing atmosphere. Similar to the above embodiment, a second coating 14 consisting of a mixture of non-oxide boron containing compound and oxide is formed. Then, upon further heating and oxidation, a continuous third boron oxide coating 16, 0.2–5 micron thick, is formed.

Turning again to FIG. 2, a cross-sectional drawing of the metallic piece 2 includes the metallic substrate, 10, preferably steel, the first coating 12, second coating 14, and the third coating 16.

EXAMPLE 1

A gear is placed into a reactive chamber after properly cleaning the surface. After pulling a vacuum to approximately $10^{-5}$ torr a boron carbide coating is deposited on the surface of the gear teeth by a sputtering method. In this method energetic ions are accelerated towards a boron carbide target. The sputtered boron carbide molecules are then directed to and condensed (deposited) on the surface of interest. This process is carried out in a non-reactive argon atmosphere. A typical deposition rate is 0.1 micron per minute.

The modified boron coating is formed by gradually introducing oxygen into the argon atmosphere after approximate 20 minutes or after a 2.0 micron thick boron carbide coating has been applied to the surface. The oxygen introduction will occur over the last 10 minutes of the coating deposition cycle. The composition of the coating will then be gradually changed from boron carbide to boron oxide in the last 0.7 micron of coating thickness. The final coating deposited using this method will have a microstructure consisting of 2.0 micron boron carbide, a 0.5 micron gradient layer of boron carbide and boron oxide, and a 0.2 micron layer of boron oxide.

Industrial Applicability

The disclosed coatings for metallic components, such as gears and pins, are particularly useful in applications where component pitting and high wear are typically encountered.

The component is a metallic substrate 2, a first coating 12 (e.g. boron carbide), a second coating 14 (e.g. a gradient layer of boron carbide and boron oxide) and a third coating 16 (e.g. boron oxide) deposited on the substrate. The first coating 12 has a thickness generally no greater than about 3.0 microns. The second coating 14 forms a thickness no greater than 1.0 microns. The third coating 16 has a thickness generally no greater than about 0.5 microns.

The basic articles of the invention of the above described metallic component 2 are shaped to a predetermined form by machining from rolled steel, by casting or forging, by consolidating steel powder, or by a combination of forming operations.

After shaping the basic article, the surface of the article is coated by physical vapor deposition with a hard coating, preferably selected from the carbides or nitrides, preferably boron carbide.

In particular, a basic article of the invention, for example a gear, is formed, and the first coating material 12 is applied to the surface of the metallic component 2. The first coating 12 forms a layer not greater than 3.0 microns in thickness.

Near the end of the formation of the first coated layer 12, oxygen is added to the reaction and an second layer 14 containing a mixture of the first non-oxide boron containing coating and boron oxide is present. Upon further oxidation, a third surface layer 16 is formed comprising boron oxide.

This coating process is carried out until the boron oxide coating covers the entire surface with a conformal layer not greater than 0.5 microns in thickness.

Articles formed according to the above are particularly useful as gears, pins, bushings, bearing races, and similar articles subjected to a combinations of high bending loads, surface wear and contact fatigue. Further, by so providing the unique coating of this invention, the resultant article yields improved service life and provides for higher power densities.

Other aspects, objects and advantages of this invention can be obtained from a study of the drawings, disclosure and the appended claims.

What is claimed is:

1. A method for enhancing the wear and pitting resistance of a metallic article adapted for use in a high wear environment, said method comprising:

preparing said metallic article;

depositing a first non-oxide boron containing thin film coating on a surface of said metallic article;

depositing a second thin film coating of functionally gradient material on said first thin film coating, said second coating including a combination of nonoxide boron containing material and boron oxide;

depositing a third thin film coating of boron oxide on said functionally gradient second thin film coating.

2. The method as in claim 1, wherein said first coating is boron carbide.

3. The method as in claim 1, wherein said first coating is boron nitride.

4. The method as in claim 1, wherein said first thin film coating has a thickness in the range of up to 3.0 microns.

5. The method as in claim 1, wherein said functionally gradient second thin film coating has a thickness in the range of up to 1.0 microns.

6. The method as in claim 1, wherein said third thin film coating has a thickness in the range of up to 0.5 microns.

* * * * *